(12) United States Patent
Diekmann et al.

(10) Patent No.: US 10,187,060 B2
(45) Date of Patent: Jan. 22, 2019

(54) OLED LIGHTING DEVICE WITH CAPACITIVE SWITCH

(71) Applicants: HELLA KGAA HUECK & CO., Lippstadt (DE); OSRAM OLED GMBH, Regensburg (DE)

(72) Inventors: Karsten Diekmann, Rattenberg (DE); Jürgen Heinrich, Kirchzarten (DE); Andrew Ingle, Allershausen (DE); Johannes Rosenberger, Regensburg (DE); Thorsten Vehoff, Regensburg (DE)

(73) Assignee: HELLA GMBH & CO. KGAA, Lippstadt (DE)

( * ) Notice: Subject to any disclaimer, the term of this patent is extended or adjusted under 35 U.S.C. 154(b) by 0 days.

(21) Appl. No.: 15/507,370

(22) PCT Filed: Aug. 24, 2015

(86) PCT No.: PCT/EP2015/069328
§ 371 (c)(1),
(2) Date: Feb. 28, 2017

(87) PCT Pub. No.: WO2016/030317
PCT Pub. Date: Mar. 3, 2016

(65) Prior Publication Data
US 2017/0288667 A1  Oct. 5, 2017

(30) Foreign Application Priority Data
Aug. 28, 2014 (DE) .................. 10 2014 217 237

(51) Int. Cl.
H01L 29/08 (2006.01)
H03K 17/96 (2006.01)
(Continued)

(52) U.S. Cl.
CPC ....... *H03K 17/962* (2013.01); *H01L 51/5203* (2013.01); *H01L 51/5253* (2013.01); *H01L 51/56* (2013.01); *H03K 2217/960795* (2013.01)

(58) Field of Classification Search
CPC .................................................... H03K 17/962
(Continued)

(56) References Cited

U.S. PATENT DOCUMENTS 6,670,754 B1 * 12/2003 Murai ..................... H01J 11/12
313/582
8,763,348 B2 7/2014 Combrink
(Continued)

FOREIGN PATENT DOCUMENTS

| DE | 103 08 514 A1 | 9/2004 |
| DE | 103 32 954 A1 | 2/2005 |
| DE | 10 2008 020 256 A1 | 10/2009 |
| DE | 10 2010 020 256 A1 | 11/2011 |
| DE | 10 2013 201 212 A1 | 7/2014 |

OTHER PUBLICATIONS

International Search Report, PCT/EP2015/069328, dated Nov. 23, 2015, 3 pgs.
German Search Report, Appl. No. 10 2014 217 237.3, dated Jun. 29, 2015, 12 pgs.

*Primary Examiner* — Caleb Henry
(74) *Attorney, Agent, or Firm* — Paul D. Strain, Esq.; Strain & Strain PLLC

(57) ABSTRACT

The invention relates to a lighting device comprising an illuminant embodied as an OLED, and comprising a capacitive switching means, which are arranged on a substrate, wherein the illuminant has a first electrically conductive electrode and a second electrically conductive electrode, wherein a layer comprising organic, electroluminescent material is arranged between the first electrode and the
(Continued)

second electrode, wherein the switching means has an electrode, wherein one electrode from the first electrode or the second electrode of the illuminant together with the electrode of the switching means is arranged in one plane, wherein a nonconductive spacing amounting to between 100 μm and 700 μm, more particularly between 400 μm and 600 μm, is present between said one electrode of the illuminant and the electrode of the switching means in the plane.

13 Claims, 3 Drawing Sheets

(51) Int. Cl.
*H01L 51/52* (2006.01)
*H01L 51/56* (2006.01)

(58) Field of Classification Search
USPC .............................................. 257/40
See application file for complete search history.

(56) References Cited

U.S. PATENT DOCUMENTS

| | | |
|---|---|---|
| 9,401,387 B2 | 7/2016 | Popp et al. |
| 2004/0238726 A1 | 12/2004 | Caldwell |
| 2008/0036746 A1 | 2/2008 | Klinghult |
| 2011/0148812 A1 | 6/2011 | Hente |
| 2014/0218328 A1 | 8/2014 | Haapakoski et al. |
| 2014/0267958 A1* | 9/2014 | Sugita ............... G02B 27/2214 349/15 |
| 2015/0028307 A1* | 1/2015 | Kim ..................... H01L 51/56 257/40 |
| 2015/0102353 A1* | 4/2015 | Wang ................. H01L 27/1248 257/72 |

\* cited by examiner ional Application No. PCT/EP2015/069328, filed Aug. 24, 2015, which is based upon and claims the benefit of priority from prior German Patent Application No. 10 2014 217 237.3, filed Aug. 28, 2014, the entire contents of all of which are incorporated herein by reference in their entirety.

OLED LIGHTING DEVICE WITH CAPACITIVE SWITCH

CROSS-REFERENCE TO RELATED PATENT APPLICATIONS

This application is a National Stage of International Application No. PCT/EP2015/069328, filed Aug. 24, 2015, which is based upon and claims the benefit of priority from prior German Patent Application No. 10 2014 217 237.3, filed Aug. 28, 2014, the entire contents of all of which are incorporated herein by reference in their entirety.

TECHNICAL FIELD

The invention relates to a lighting device, such as in particular an optoelectronic lighting device according to the preamble of claim 1.

PRIOR ART

Optoelectronic lighting devices in which both lighting means formed as OLEDs and switching means are integrated in the lighting device are known for example from DE 103 08 514 A1. DE 103 08 514 A1 discloses a lighting means formed as an OLED that has a first conductive electrode layer and a second conductive electrode layer, a layer comprising organic, electroluminescent material being arranged between the two electrode layers. The OLED formed in this way is arranged on one side of a substrate, the switching means being arranged on the same side of the substrate or on the other side of the substrate. The electrode of the switching means, lying in a parallel but offset plane in relation to the electrodes of the OLED, causes crosstalk between the electrodes of the OLED and the switching means to occur upon actuation, which is considered to be undesirable because it results in unintended control effects.

DE 10 2008 020 256 A1 discloses an optoelectronic lighting device with a lighting means formed as an OLED that similarly has a first conductive electrode layer and a second conductive electrode layer, a layer comprising organic, electroluminescent material being arranged between the two electrode layers. The OLED formed in this way is arranged on a substrate, switching means with their electrodes also being arranged in the plane of the OLED, but with the electrodes arranged laterally offset from the electrodes of the OLED.

In this case, the electrode of the switching means is formed on the same plane as an electrode of the OLED, the same material also being used. The electrode of the switching means is however electrically separated from the electrode of the OLED. If there is too small a spacing between the electrode of the switching means and the electrode of the OLED, crosstalk also takes place in the case of this configuration, with an adverse effect on the level swing of the useful signal that is necessary for the evaluation of the capacitive switching means. If there is too great a spacing between the switching means and the OLED, crosstalk can indeed be avoided but it is no longer necessarily intuitively perceptible that the switching means is assigned as an operator control element to an associated luminous area of the OLED, which means that there is a reduction in the ease of use and also a resultant severe restriction of the freedom of design in the arrangement of the switching means.

SUMMARY OF THE INVENTION, PROBLEM, SOLUTION AND ADVANTAGES

The problem addressed by the invention is that of providing a lighting device that is improved in comparison with the prior art and reduces or avoids adverse influences between the lighting means and the switching means, and nevertheless allows a clearly evident assignment between the lighting means and the switching means and ensures a greater freedom of design. The invention also addresses the problem of providing a method for producing a lighting device.

The problem with regard to the lighting device is solved by the features of claim 1.

An exemplary embodiment of the invention relates to a lighting device with a lighting means formed as an OLED and with a capacitive switching means, which are arranged on a substrate, the lighting means having a first electrically conductive electrode and a second electrically conductive electrode, a layer comprising organic, electroluminescent material being arranged between the first electrode and the second electrode, the switching means having an electrode, one electrode out of the first electrode and the second electrode of the lighting means being arranged in a plane with the electrode of the switching means, wherein between the one electrode of the lighting means and the electrode of the switching means in the plane there is a non-conducting spacing, which is between 100 µm and 700 µm, in particular between 400 µm and 600 µm. By choosing the spacing in this range, the useful swing signal is suitably chosen such that it goes over in transition from a region of higher slope to a region of reduced slope when the useful swing signal is plotted against the spacing width. In this case, the useful swing signal of the capacitive switching means is the measured difference between manual actuation on the light emission area of the lighting means and finger actuation on the switching means. It is found here that the useful swing signal increases linearly with a first, greater slope for spacing widths of less than approximately 100 µm to in particular 400 µm and increases linearly with a smaller, second slope for spacing widths of more than approximately 700 µm, such as in particular 600 µm. It follows from this that the spacing width of less than 100 µm to 400 µm is too small for a reliable evaluation of the signals and, with spacing widths of more than 700 µm to 600 µm, no significant improvement is achieved any longer because the slope is too small in this range. The thickness of the electrodes is in this case approximately 100 nm to approximately 200 nm.

It is particularly advantageous in this case if the first electrode or the second electrode of the lighting means and the electrode of the switching means are formed as an electrode layer on the substrate. This allows easy production to be achieved if the electrodes are applied as electrode layers, because efficient processes for building up layers can be carried out.

The substrate is preferably formed from glass and/or from a flexible material. The flexible material may therefore be for example a plastic.

It is also advantageous if the first electrode or the second electrode of the lighting means and the electrode of the switching means are formed as a patterned electrically conductive layer on the substrate. The patterning allows the later geometrical design to be influenced already during the production of the layers.

It is also advantageous in this case if the conductive layer on the substrate is a transparent electrically conductive layer, such as in particular a transparent electrically conductive oxide layer. This allows the emitted light also to pass through this electrode layer.

It is similarly expedient if the electrically conductive layer consists of tin oxide, zinc oxide, cadmium oxide, titanium oxide, indium oxide or indium tin oxide or of some other oxide compound containing zinc, tin, indium, cadmium, magnesium and/or gallium or of a mixture of oxides. These compounds are electrically conductive and partially also transparent or semitransparent to light in the visible wavelength range. Furthermore, these materials can be deposited well by layer-generating processes to form thin layers.

It is also advantageous if the electrode of the switching means is provided on the side remote from the substrate with a first thin-film encapsulation. Such thin-film encapsulations are also known as TFE. These may be formed with organic or inorganic materials. In particular, such thin-film encapsulations are formed as multilayers of inorganic and/or organic materials. This allows the material of the electrode of the switching means or the OLED material or the entire structure of the lighting device to be hermetically sealed. The organic materials sometimes have the advantage that they are also of a flexible form, and therefore allow certain dynamics of the material of the lighting means and of the switching means.

It is also advantageous in this case if the electrode remote from the substrate, that is to say not the electrode applied directly to the substrate or not the electrode lying closer to the substrate of the lighting means, is provided with a second thin-film encapsulation. Consequently, the entire structure including the OLED materials can also be protected or encapsulated. It is advantageous in this case if the second thin-film encapsulation covers over the first thin-film encapsulation. It may also be advantageous if the two thin-film encapsulations are formed as one part or are integrated with one another.

It is particularly advantageous if the second thin-film encapsulation is covered by a covering. This once again allows an additional protection to be provided.

It is also particularly advantageous if the region of the lighting means that is visible as a luminous area on the surface is of a transparent, reflective or matt form. This allows suitable illuminating effects to be achieved. In this case, the reflective appearance may be caused by the electrode remote from the substrate. The reflective surface may also be understood in the sense of a smooth surface that exhibits a partly mirrored effect.

It is also expedient according to the idea of the invention if the region of the switching means that is formed as a switching region on the surface is of a transparent, reflective or matt form. This similarly allows suitable effects to be achieved, in order to set the visibility of the switching means apart from the luminous area of the lighting means.

It is also advantageous if the switching region is provided with a metallic border. This can similarly serve for better visual separation of the switching means from the lighting means, so that the operator can identify the switching means more quickly, and consequently also operate the switching means more quickly.

The problem with regard to the method is solved by the features of claim 13.

An exemplary embodiment of the invention relates to a method for producing a lighting device, such as in particular a lighting device according to the invention described above, the lighting device being formed with a lighting means formed as an OLED and with a capacitive switching means, which are arranged on a substrate, the lighting means having a first electrically conductive electrode and a second electrically conductive electrode, a layer comprising organic, electroluminescent material being arranged between the first electrode and the second electrode, the switching means having an electrode, one electrode out of the first electrode and the second electrode of the lighting means being arranged in a plane with the electrode of the switching means, wherein the one electrode of the lighting means and the electrode of the switching means are applied to the substrate and delimited from one another by a patterning step before the layers that are subsequently to be applied are applied.

It is in this case particularly advantageous if the delimitation leads to a distance between the electrodes in the plane with a non-conducting spacing, the spacing being between 100 µm to 400 µm on the one hand and 700 µm to 600 µm on the other hand, that is to say between 100 µm and 700 µm and in particular between 400 µm and 600 µm.

Further advantageous refinements are described by the following description of the figures and by the subclaims.

BRIEF DESCRIPTION OF THE DRAWINGS

The invention is described in more detail below on the basis of at least one exemplary embodiment with reference to the drawings, in which.

PREFERRED EMBODIMENT OF THE INVENTION

Figure 1:
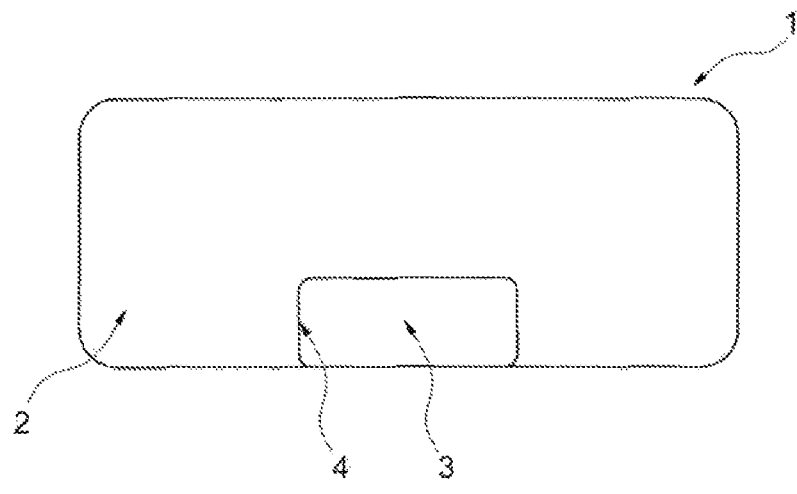
FIG. 1 shows a schematic view of an exemplary embodiment of a lighting device.

FIG. 1 shows in a schematic representation a lighting device 1, which has a lighting means 2 and a switching means. The lighting means 2 is of a two-dimensional form and in the embodiment shown encloses the switching means 3 on three sides, and consequently integrates the switching means in the surface area of the lighting device 1. The lighting means 2 is preferably of a rectangular form with rounded corners and accommodates the switching means 3 on one of the longitudinal sides of the latter. In this exemplary embodiment, the switching means is also of a rectangular form with rounded corners. Provided between the switching means 3 and the lighting means 2 there is a spacing 4, so that there is a clear separation between the two functional regions.

According to the invention, not only the lighting means 2 and the switching means 3 but also the profile 4 of the spacing may be formed differently. The switching means 3 may also be arranged and aligned differently in relation to the lighting means 2 in the lighting device 1. It is for instance also possible for the switching means 3 to be enclosed by the lighting means on all sides. It is also possible to provide a number of switching means 3, by means of which a lighting means 2 or a plurality of lighting means 2 can be activated or can be actuated.

Figure 2:
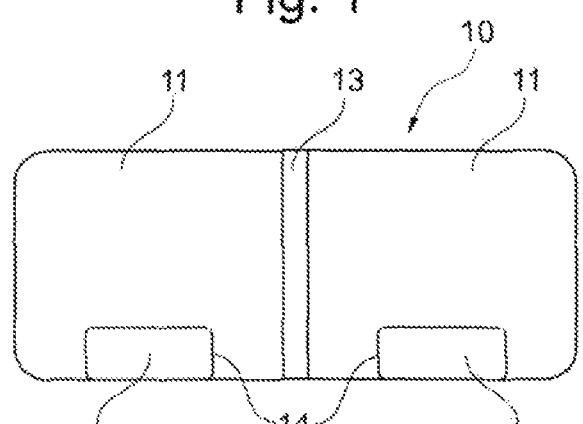
FIG. 2 shows a schematic representation of a further exemplary embodiment of a lighting device.

FIG. 2 shows in a schematic representation a further exemplary embodiment of a lighting device 10, which has two lighting means 11 and two switching means 12. The two lighting means 11 are arranged adjacent to one another and are separated from one another by a non-luminous strip 13. In this way, it is possible for example to create an interior light for a motor vehicle that can be controlled separately on the right and left.

The lighting means 11 are each of a two-dimensional form and in the embodiment shown in each case enclose one of the switching means 12 on three sides, and integrate the respective switching means 12 in the surface area of the lighting device 1. The lighting means 11 is in turn of a substantially rectangular form, with partially rounded corners, the two lighting means being formed symmetrically in relation to the non-luminous strip 13. In the exemplary embodiment of FIG. 2, the respective switching means are of a substantially rectangular form with rounded corners. The two switching means are arranged on a common longitudinal side of the lighting device 10.

Provided between the switching means 12 and the respective lighting means 11 there is again a corresponding spacing 14, which separates the lighting means 11 from the respective switching means. This achieves separation of the two functional regions of the lighting means 11 and the switching means 12.

Figure 3:
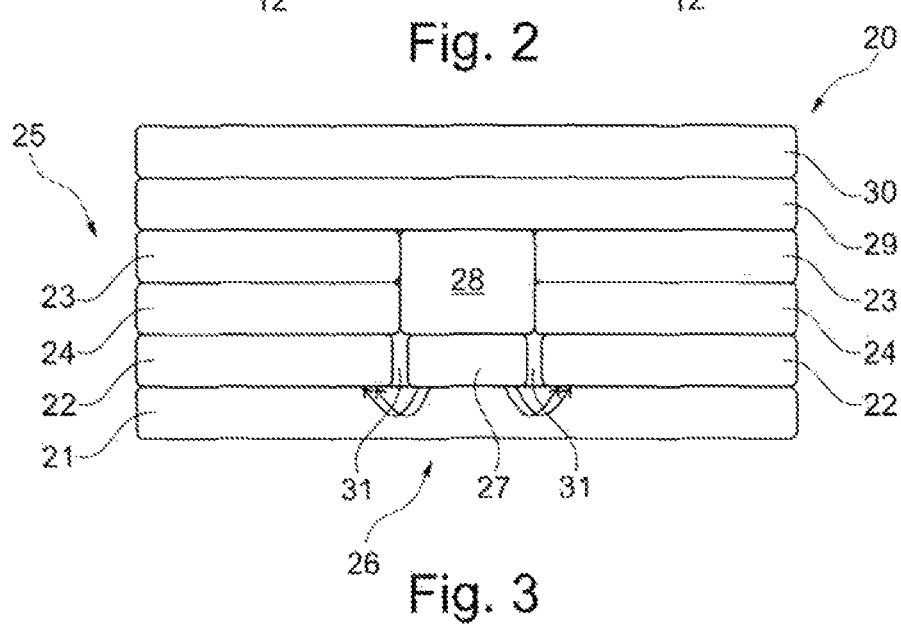
FIG. 3 shows a section through an exemplary embodiment of a lighting device.

FIG. 3 shows a section through the layer structure of the lighting device 20. Arranged on a substrate 21, which is advantageously formed as a substrate glass, there is the layer structure of the OLED 25 with a first electrode 22, a second electrode 23 and a layer 24 of an organic, electroluminescent material between the two electrodes 22, 23. Arranged in a clearance between the OLED 25 formed in this way there is a capacitive switching means 26, which has an electrode 27, which is formed on the substrate 21. In this case, the electrode 27 is preferably formed from the same material as the electrode 22 of the OLED. The electrode is preferably formed as an electrically conductive layer of tin oxide, zinc oxide, cadmium oxide, titanium oxide, indium oxide or indium tin oxide or of some other oxide compound containing zinc, tin, indium, cadmium, magnesium and/or gallium or of a mixture of oxides. These compounds are electrically conductive and at least partially also transparent or semitransparent to light in the visible wavelength range.

On the electrode 27 there is applied a thin-film encapsulation (TFE) 28. Provided above this thin-film encapsulation 28 there is over the further electrodes 23 a further thin-film encapsulation 29, which is covered by a covering layer 30, for example of a glass.

Provided between the electrode 22 and the electrode 27 there is a spacing 31, which lies in the range according to the invention between 100 µm and 700 µm, in particular between 400 µm and 600 µm, so that there is no crosstalk between the two electrodes that could upon actuation lead to disturbing effects.

Figure 4:
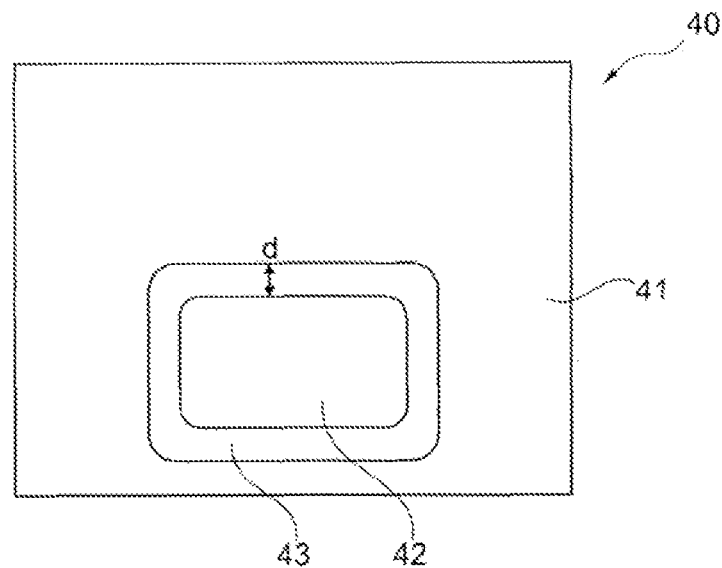
FIG. 4 shows a partial view of a lighting device according to the invention.

FIG. 4 shows in a schematic representation a lighting device 40 with a lighting means 41 formed as an OLED and with a switching means 42, the lighting means 41 being separated from the switching means by a spacing 42 with the distance 43, d.

Figure 5:
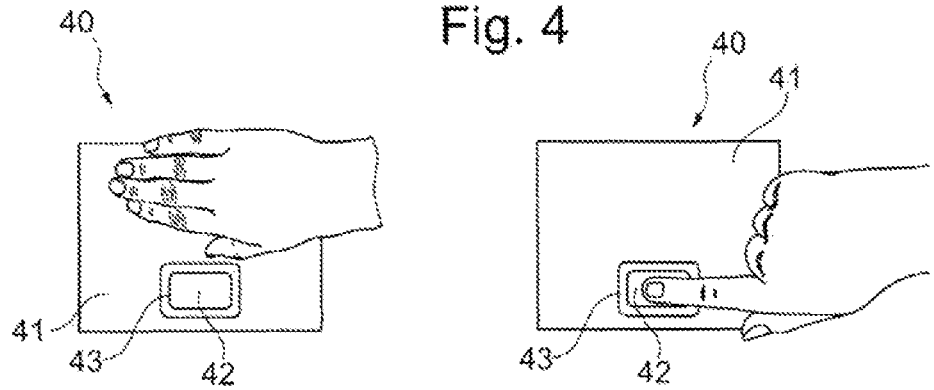
FIG. 5 shows a schematic view of operating scenarios of a lighting device according to the invention.

If there is sufficient distance 43, d, actuation over a large area of the light emission area of the lighting means 41 according to the left part of the figure of FIG. 5 does not bring about any unwanted change in capacitance, and consequently does not bring about any consequently triggered fault sensing of the capacitive sensor as a switching means 42. If operated with one finger on the switching means 42, according to the right part of the figure of FIG. 5, a sufficiently differentiable useful signal of the switching means 42 is generated.

Figure 6:
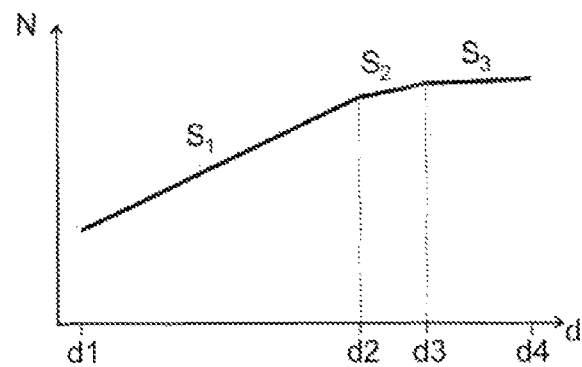
FIG. 6 shows a diagram to represent a profile of a level swing of a useful signal as a function of the spacing width.

FIG. 6 shows the useful swing signal N as a function of the spacing width d. It can be seen that the useful swing signal N rises substantially linearly in three regions, rising with the greatest slope S1 in a first region from d1 to d2, then with a smaller slope S2 between d2 and d3 and with an again smaller slope S3 between d3 and approximately d4. For d less than d2, the useful swing signals N are too small for good resolution and, for d greater than d3, the slope S3 is so small that an increase in the spacing width does not show any further significant effect. The characteristic spacing width in this case lies substantially between 100 µm and 700 µm, in particular between 400 µm and 600 µm.

Figure 7:
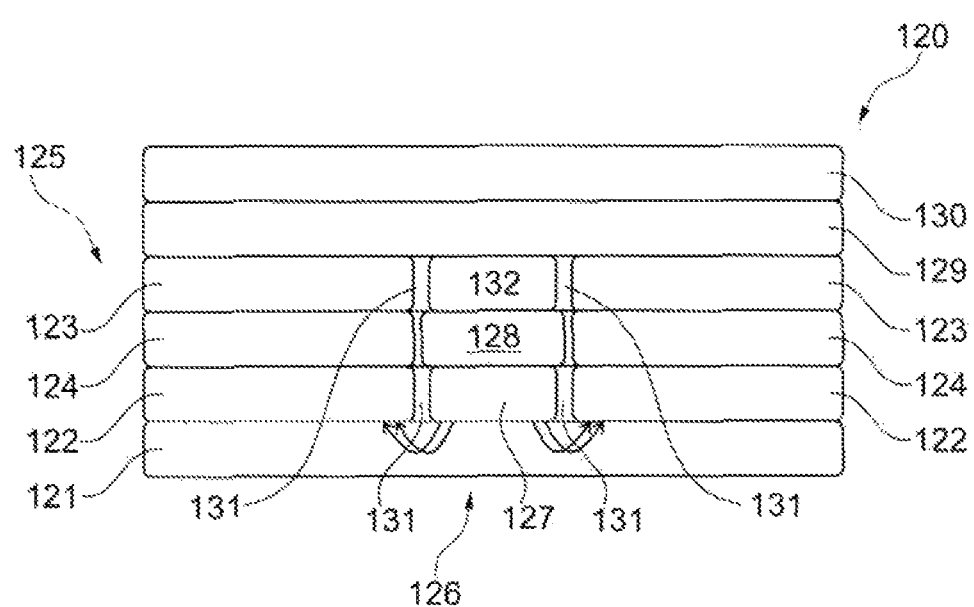
FIG. 7 shows a section through a further exemplary embodiment of a lighting device.

FIG. 7 shows a section through the layer structure of a further exemplary embodiment of a lighting device 120. Arranged on a substrate 121, which is advantageously formed as a substrate glass, there is the layer structure of the OLED 125 with a first electrode 122, a second electrode 123 and a layer 124 of an organic, electroluminescent material between the two electrodes 122, 123. Arranged in a clearance between the OLED 125 formed in this way there is a capacitive switching means 126, which has an electrode 127, which is formed on the substrate 121. A further electrode 132 may also be provided, spaced apart from the electrode 127. In a further exemplary embodiment, this further electrode may also be provided as an alternative to the electrode 127.

In this case, the electrode 127 is preferably formed from the same material as the electrode 122 of the OLED or furthermore the electrode 132 is formed from the same material as the electrode 123. The electrode 122, 123, 127, 132 is preferably formed as an electrically conductive layer of tin oxide, zinc oxide, cadmium oxide, titanium oxide, indium oxide or indium tin oxide or of some other oxide compound containing zinc, tin, indium, cadmium, magnesium and/or gallium or of a mixture of oxides. These compounds are electrically conductive and at least partially also transparent or semitransparent to light in the visible wavelength range.

On the electrode 127 there is applied a thin-film encapsulation (TFE) 128. Applied above this thin-film encapsulation 128 there is the further electrode 132, there being provided over the further electrodes 123, 132 a further thin-film encapsulation 129, which is covered by a covering layer 130, for example of a glass.

Provided between the electrode 122 and the electrode 127 there is a spacing 131, which lies in the range according to the invention between 100 µm and 700 µm, in particular between 400 µm and 600 µm, so that there is no crosstalk between the two electrodes 122 and 127 or 123 and 132 that could upon actuation lead to disturbing effects.

According to the idea of the invention, it is in this case advantageous in particular if the substrate is formed from glass and/or from a flexible material, such as for example from a plastic.

LIST OF DESIGNATIONS

1 Lighting device
2 Lighting means
3 Switching means
4 Spacing
10 Lighting device
11 Lighting means
12 Switching means
13 Strip
14 Spacing
20 Lighting device 21 Substrate
22 Electrode
23 Electrode
24 Organic layer
25 OLED
26 Switching means
27 Electrode
28 Thin-film encapsulation
29 Thin-film encapsulation
30 Covering layer
31 Spacing
40 Lighting device
41 Lighting means
42 Switching means
43 Distance
120 Lighting device
121 Substrate
122 Electrode
123 Electrode
124 Organic layer
125 OLED
126 Switching means
127 Electrode
128 Thin-film encapsulation
129 Thin-film encapsulation
130 Covering layer
131 Spacing
132 Electrode

The invention claimed is:

1. A method for producing a lighting device the lighting device being formed with an OLED lighting element and with a capacitive switch, wherein the OLED lighting element and the capacitive switch are arranged on a substrate, the OLED lighting element having a first electrically conductive electrode and a second electrically conductive electrode,
  a layer with organic, electroluminescent material being arranged between the first electrode and the second electrode,
  the capacitive switch having an electrode,
  one electrode out of the first electrode and the second electrode of the OLED lighting element being arranged in a plane with the electrode of the capacitive switch, wherein the one electrode of the OLED lighting element and the electrode of the capacitive switch are applied to the substrate and delimited from one another by a patterning step before the layers that are subsequently to be applied are applied.

2. The method as claimed in claim 1,
wherein the delimitation leads to a distance between the electrodes in the plane with a non-conducting spacing, the spacing being between 400 μm and 600 μm.

3. The method as claimed in claim 1,
wherein the delimitation leads to a distance between the electrodes in the plane with a non-conducting spacing, the spacing being between 100 μm and 700 μm.

4. The method according to claim 1,
wherein the first electrode or the second electrode of the OLED lighting element and the electrode of the capacitive switch are formed as a patterned electrically conductive layer on the substrate.

5. The method according to claim 4,
wherein the electrically conductive layer on the substrate is formed as a transparent electrically conductive layer comprising a transparent electrically conductive oxide.

6. The method according to claim 5,
wherein the transparent electrically conductive oxide is selected from the group consisting of tin oxide, zinc oxide, cadmium oxide, titanium oxide, indium oxide or indium tin oxide or of some other oxide compound containing zinc, tin, indium, cadmium, magnesium and/or gallium or of a mixture of oxides.

7. The method according to claim 1,
wherein a second electrode of the capacitive switch is arranged on a side remote from the substrate and is provided with a first thin-film encapsulation.

8. The method according to claim 7,
wherein the second electrode of the OLED lighting element is arranged on a side remote from the substrate and is provided with a second thin-film encapsulation.

9. The method according to claim 8,
wherein the second thin-film encapsulation covers over the first thin-film encapsulation.

10. The method according to claim 9,
wherein the second thin-film encapsulation is covered by a covering.

11. The method according to claim 1,
wherein the substrate material comprises glass or a flexible material.

12. The method according to claim 1,
wherein the electrode of the capacitive switch is provided on a side remote from the substrate with a first thin-film encapsulation;
wherein applied above the first thin-film encapsulation is a further electrode; and
wherein provided over the further electrode is a second thin-film encapsulation.

13. The method according to claim 12,
wherein the second thin-film encapsulation covers the capacitive switch, the OLED lighting element, and the spacing.

* * * * *